United States Patent
Chen et al.

(10) Patent No.: US 11,251,336 B2
(45) Date of Patent: Feb. 15, 2022

(54) SEMICONDUCTOR DEVICE

(71) Applicant: EPISTAR CORPORATION, Hsinchu (TW)

(72) Inventors: Hsin-Kang Chen, Hsinchu (TW); Jung-Jen Li, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 23 days.

(21) Appl. No.: 16/725,040

(22) Filed: Dec. 23, 2019

(65) Prior Publication Data

US 2020/0203569 A1  Jun. 25, 2020

(30) Foreign Application Priority Data

Dec. 24, 2018  (TW) .................................. 107146844

(51) Int. Cl.
| | |
|---|---|
| *H01L 33/14* | (2010.01) |
| *H01L 33/38* | (2010.01) |
| *H01L 27/02* | (2006.01) |
| *H01L 33/00* | (2010.01) |
| *H01L 33/02* | (2010.01) |

(52) U.S. Cl.
CPC ........ *H01L 33/145* (2013.01); *H01L 27/0248* (2013.01); *H01L 33/0008* (2013.01); *H01L 33/025* (2013.01); *H01L 33/38* (2013.01)

(58) Field of Classification Search
CPC . H01L 33/145; H01L 33/0008; H01L 33/025; H01L 33/38; H01L 27/0248
See application file for complete search history.

(56) References Cited

U.S. PATENT DOCUMENTS

| | | | |
|---|---|---|---|
| 6,472,688 B2 | 10/2002 | Miyata | |
| 7,173,288 B2* | 2/2007 | Lee | .......... H01L 27/15 257/94 |
| 7,483,464 B2* | 1/2009 | Kuwata | ................. H01S 5/0261 372/50.1 |
| 7,693,201 B2* | 4/2010 | Albrecht | ............. H01S 5/06825 372/50.1 |
| 7,995,636 B2 | 8/2011 | Murakami et al. | |
| 8,164,105 B2* | 4/2012 | Park | ........................ H01L 27/15 257/94 |

(Continued)

FOREIGN PATENT DOCUMENTS

TW            I488337 B         6/2015

*Primary Examiner* — Mark W Tornow
(74) *Attorney, Agent, or Firm* — Juan Carlos A. Marquez; Marquez IP Law Office, PLLC

(57) ABSTRACT

A semiconductor device includes a semiconductor stack having a first-type semiconductor structure, an active structure, and a second-type semiconductor structure disposed on the first-type semiconductor structure. The second-type semiconductor structure has a doping concentration. A first portion includes a part of the first-type semiconductor structure, the active structure, and the second-type semiconductor structure, and has a current confining region. A second portion includes a part of the first-type semiconductor structure, the active structure, and the second-type semiconductor structure, and includes a first-type heavily doped region in the second-type semiconductor structure. The first-type heavily doped region includes a doping concentration higher than that of the second-type semiconductor structure.

20 Claims, 4 Drawing Sheets

(56) References Cited

U.S. PATENT DOCUMENTS

| | | | |
|---|---|---|---|
| 9,048,629 B2* | 6/2015 | Murty | H01S 5/04257 |
| 2014/0231832 A1* | 8/2014 | Lee | H01L 33/48 |
| | | | 257/88 |
| 2015/0162376 A1* | 6/2015 | Yoon | H01L 27/15 |
| | | | 257/99 |

* cited by examiner

SEMICONDUCTOR DEVICE

CROSS REFERENCE TO RELATED APPLICATION

This application claims the right of priority based on TW Application Serial No. 107146844, filed on Dec. 24, 2018, and the content of which is hereby incorporated by reference in its entirety.

FIELD OF DISCLOSURE

The present disclosure relates to a semiconductor device, and particularly to a semiconductor device having a heavily doped region.

BACKGROUND OF THE DISCLOSURE

The descriptions herein merely provide background information related to the present disclosure and do not necessarily constitute prior arts.

Common light-emitting devices, such as Light-Emitting Diodes (LEDs) or Vertical Cavity Surface Emitting Lasers (VCSELs), need to additionally connect to electrostatic protection devices, such as Zener Diode or Transient-Voltage-Suppression diode, to prevent the electrostatic voltage from damaging to the light-emitting devices during operation. For example, a light-emitting device and a corresponding electrostatic protection device can be disposed in the same circuit structure through a packaging process to manufacture a light-emitting module having an antistatic function.

SUMMARY OF THE DISCLOSURE

Accordingly, some embodiments of the present disclosure provide a semiconductor device.

A semiconductor device of one embodiment of the present disclosure includes a semiconductor stack having a first-type semiconductor structure, an active structure and a second-type semiconductor structure disposed on the first-type semiconductor structure. The second-type semiconductor structure has a doping concentration. A first portion includes a part of the first-type semiconductor structure, a part of the active structure, and a part of the second-type semiconductor structure, and has a current confining region. A second portion includes a part of the first-type semiconductor structure, a part of the active structure, and a part of the second-type semiconductor structure, and includes a first-type heavily doped region in the second-type semiconductor structure. The first-type heavily doped region includes a doping concentration wherein the doping concentration of the first-type heavily doped region is higher than the doping concentration of the second-type semiconductor structure.

The purpose, technical contents, features, and achieved effects of the present disclosure will become more apparent from the detailed description of the following embodiments along with the appended drawings.

DETAILED DESCRIPTION OF THE DISCLOSURE

Figure 1:
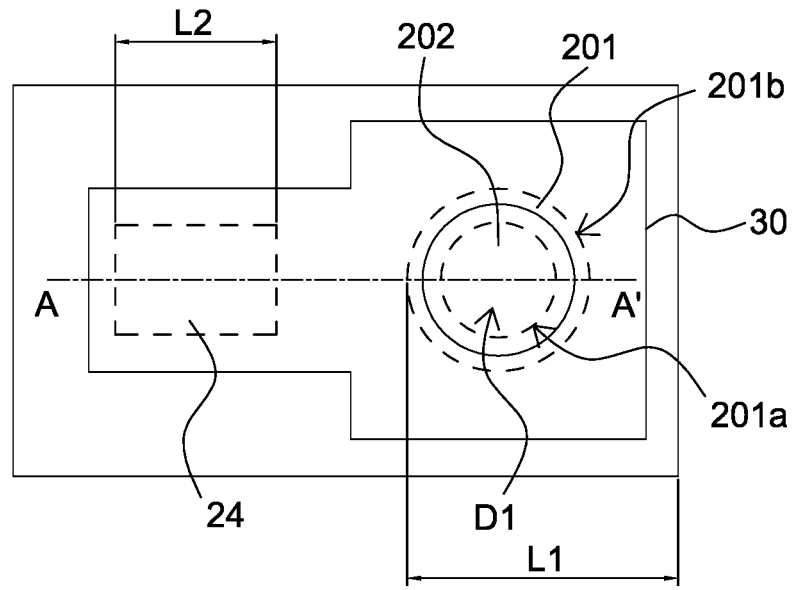
FIG. 1 shows a top view of a semiconductor device of one embodiment in accordance with the present disclosure.

The embodiments of the present disclosure will be described in detail below with reference to the drawings. In the descriptions of the specification, specific details are provided for a full understanding of the present disclosure. The same or similar elements in the drawings will be denoted by the same or similar symbols. It is noted that the drawings are for illustrative purposes only and do not represent the actual dimensions or quantities of the elements. Some of the details may not be fully sketched in order for the conciseness of the drawings.

Figure 2:
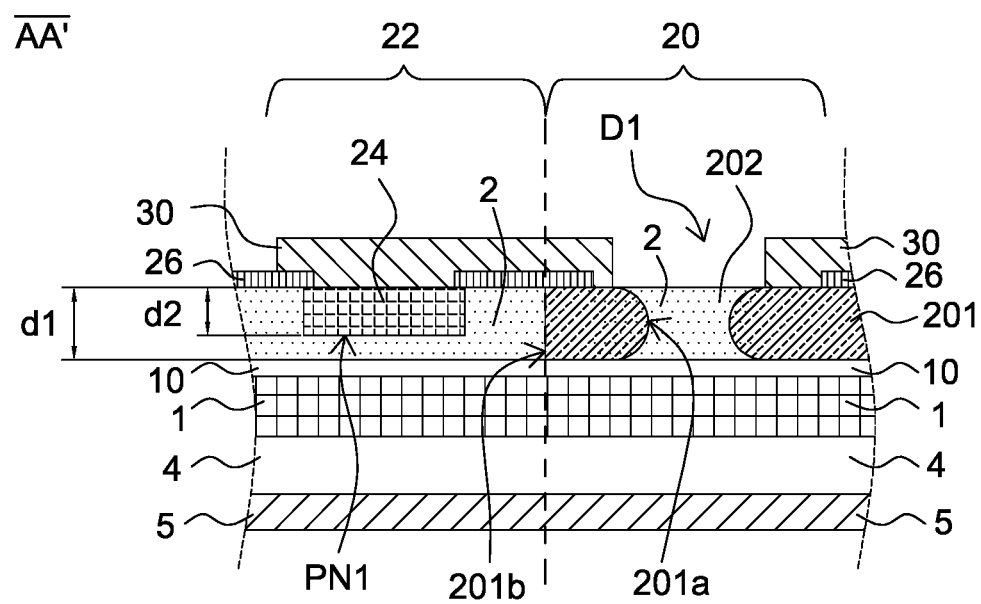
FIG. 2 shows a side view of a semiconductor device of one embodiment in accordance with the present disclosure taken along cross-section line AA' of FIG. 1.

FIG. 1 shows a top view of a semiconductor device of one embodiment in accordance with the present disclosure. FIG. 2 shows a side view of a semiconductor device taken along cross-section line AA' of FIG. 1. Referring to FIGS. 1 and 2, a semiconductor device according to an embodiment of the present disclosure includes a semiconductor stack including a first-type semiconductor structure 1, an active structure 10 on the first-type semiconductor structure 1, and a second-type semiconductor structure 2 on the active structure 10. The semiconductor device includes a first portion 20 as a light-emitting region and a second portion 22 as an electrostatic protection region. Therefore, both the first portion 20 and the second portion 22 include a portion of the first-type semiconductor structure 1, a portion of the active structure 10, and a portion of the second-type semiconductor structure 2.

In one embodiment, the semiconductor device is a Light-Emitting Diode (LED), a Vertical Cavity Surface Emitting Laser (VCSEL), or an Edge Emitting Laser (EEL) but is not limited thereto. In the present disclosure, the first-type and the second-type are different conductivity types. P-type means holes being the majority carrier whereas n-type means electrons being the majority carrier in a semiconductor material. For example, the conductivity type of the first-type semiconductor structure 1 is n-type and the conductivity type of the second-type semiconductor structure 2 is p-type, or the conductivity type of the first-type semiconductor structure 1 is p-type and the conductivity of the second-type semiconductor structure 2 is n-type. In some embodiments, the active structure 10 includes MQW (Multiple Quantum Wells) layers to enhance luminous efficiency but is not limited thereto. In one embodiment, the materials of the first-type semiconductor structure 1, the second-type semiconductor structure 2, and the active structure 10 include group III-V compound semiconductors, such as AlGaInP, AlGaP, AlInP, GaInP, AlP, GaP, InP, AlGaInAs, AlGaAs, AlInAs, GaInAs, AlAs, GaAs, InAs, InGaAsP, GaAsP, InAsP, GaN, InGaN, or AlGaN. In the embodiments of the present disclosure, unless otherwise described, the above-mentioned chemical formulas include "stoichiometric compounds" or "non-stoichiometric compounds". A "stoichiometric compound" is, for example, a compound in which the total number of atoms of group III elements is the same as the total number of atoms of group V elements. On the contrary, a "non-stoichiometric compound" is, for example, a compound in which the total number of atoms of III-group elements is different from the total number of atoms of group V elements. For example, a compound has a chemical formula of AlGaInAs represents that the compound includes Al, Ga, and In as the group III elements and As as the group V element, wherein the total number of atoms of the group III elements (Al, Ga, and In) is the same as or different to the total number of atoms of the group V elements (As). In addition, if the above-mentioned compounds represented by the chemical formulas are stoichiometric compounds, then AlGaInAs represents for $(Al_{y1}Ga_{(1-y1)})_{1-x1}In_{x1}As$, wherein $0<x1<1$ and $0<y1<1$; AlGaInP represents for $(Al_{y2}Ga_{(1-y2)})_{1-x2}In_{x2}P$, wherein $0<x2<1$ and $0<y2<1$; InGaAsP represents for $In_{x3}Ga_{1-x3}As_{1-y3}P_{y3}$, wherein $0<x3<1$ and $0<y3<1$; AlGaP represents for $Al_{x4}Ga_{1-x4}P$, wherein $0<x4<1$. Depending on the material of the active structure 10, the semiconductor device can emit infrared light with a peak wavelength between 700 nm and 1700 nm, red light with a peak wavelength between 610 nm and 700 nm, yellow light with a peak wavelength between 570 nm and 590 nm, green light with a peak wavelength between 490 nm and 570 nm, blue or deep blue light with a peak wavelength between 400 nm and 490 nm, or UV light with a peak wavelength between 250 nm and 400 nm.

In the present embodiment, each of the first-type semiconductor structure 1 and the second-type semiconductor structure 2 includes a plurality of layers having different refractive indices alternately and periodically stacked to form a distributed Bragg reflector (DBR). The first-type semiconductor structure 1 and the second-type semiconductor structure 2 can reflect the light emitted by the active structure 10, and the reflectivity of the first-type semiconductor structure 1 is greater than that of the second-type semiconductor structure 2 such that the light emitted by the active structure 10 can be reflected multiple times between the two DBRs to form coherent light and exited in the direction toward the second-type semiconductor structure 2. Therefore, the first portion 20 as the light-emitting region can be regarded as a VCSEL. In the present embodiment, the first-type semiconductor structure 1 includes a plurality of first layers and a plurality of second layers stacked alternately, wherein the refractive index of the second layer is different from the refractive index of the first layer. For example, the material of the first layer is $Al_{m1}Ga_{(1-m1)}As$ and the material of the second layer is $Al_{n1}Ga_{(1-n1)}As$ wherein m1 is different from n1. Further, the second-type semiconductor structure 2 includes a plurality of third layers and a plurality of fourth layers stacked alternately, wherein the refractive index of the third layer is different from the refractive index of the fourth layer. For example, the material of the third layer is $Al_{m2}Ga_{(1-m2)}As$ and the material of the fourth layer is $Al_{n2}Ga_{(1-n2)}As$, and m2 is different from n2. In some embodiments, m1, m2, n1, and n2 may be between 0 and 1 and include 0 and 1.

Furthermore, the first portion 20 further includes a current confinement region 201 located in the second-type semiconductor structure 2 for limiting the path of the current to reduce the threshold current ($I_{th}$) of the light-emitting region. In other embodiments, the current confinement region 201 can be located in the first-type semiconductor structure 1, between the first-type semiconductor structure 1 and the active structure 10, or between the active structure 10 and the second-type semiconductor structure 2. In the present embodiment, as shown in FIG. 1, the central region of the first portion 20 is surrounded by the current confinement region 201 and defines a current conduction region 202, and the conductivity of the current confinement region 201 is lower than the current conduction region 202 so that the current injected into the first portion 20 is focused in the current conduction region 202. In detail, the current confinement region 201 has an inner contour 201a and an outer contour 201b, and the inner contour 201a defines the current conduction region 202. Further, the outer contour 201b can be a boundary dividing the first portion 20 and the second portion 22, but the boundary is not limited to the outer contour 201b. Moreover, the thickness of the current confinement region 201 of FIG. 2 is merely exemplary, and in some embodiments, the thickness of the current confinement region 201 is less than the thickness of the second-type semiconductor structure 2.

The current confinement region 201 can be formed by an oxidation process, an ion implantation process, or the like. For example, the ion implantation process of the present embodiment can be performed by implanting hydrogen ions ($H^+$), helium ions ($He^+$) or argon ions ($Ar^+$) at the predetermined region for forming the current confinement region 201. In the present embodiment, the second-type semiconductor structure 2 of the first portion 20 is physically isolated from the second-type semiconductor structure 2 of the second portion 22 through the current confinement region 201.

Referring to FIGS. 1 and 2, the second portion 22 includes a first-type heavily doped region 24 in the second-type semiconductor structure 2. The conductivity type of the first-type heavily doped region 24 is different from that of the second-type semiconductor structure 2 such that a first PN junction PN1 is between the first-type heavily doped region 24 and the second-type semiconductor structure 2, and therefore, the second portion 22 has an electrostatic protection effect on the first portion 20 as described later. Further, the conductivity type of the first-type heavily doped region 24 is the same as that of the first-type semiconductor structure 1 and a portion of the second-type semiconductor structure 2 is located between the first-type heavily doped region 24 and the active structure 10. In the present embodiment, the conductivity type of the first-type heavily doped region 24 and that of the first-type semiconductor structure 1 are n-type, and the conductivity type of the second-type semiconductor structure 2 is p-type. For example, the first-type semiconductor structure 1 is doped with a dopant of silicon (Si) ion, the second-type semiconductor structure 2 is doped with a dopant of carbon (C) ion, and the first-type heavily doped region 24 is doped with a dopant of arsenic (As) ion. In one embodiment, the doping concentration of the first-type heavily doped region 24 is higher than the doping concentration of the second-type semiconductor structure 2 to effectively achieve the electrostatic protection effect. For example, the doping concentration of the first-type heavily doped region 24 is equal to or greater than one hundred times the doping concentration of the second-type semiconductor structure 2.

In this embodiment, the second-type semiconductor structure 2 has a first thickness d1, and the first-type heavily doped region 24 has a second thickness d2 less than the first thickness d1. Preferably, the second thickness d2 is greater than or equal to half of the first thickness d1, that is, the doping depth of the first-type heavily doped region 24 exceeds half of the first thickness d1 of the second-type semiconductor structure 2. In this embodiment, the first thickness d1 refers to a maximum distance between the surface of the second-type semiconductor structure 2 distant from the first-type semiconductor structure 1 and the other surface of the second-type semiconductor structure 2 close to the first-type semiconductor structure 1, and the second thickness d2 refers to the maximum distance between the surface of the first-type heavily doped region 24 distant from the surface of the first-type semiconductor structure 1 to the other surface of first-type heavily doped region 24 close to the first-type semiconductor structure 1.

In this embodiment, the first portion 20 is a light-emitting area, and the second portion 22 is as an electrostatic protection structure of the light-emitting area. In this embodiment, the area of the first-type heavily doped region 24 of the second portion 22 is smaller than the area of the active structure 10 of the first portion 20 so that the light-emitting region of the semiconductor device has a larger area, thereby increasing space utilization. For example, in FIG. 1, the side length L1 of the active structure 10 in the first portion 20 may be 20 mils and the side length L2 of the first-type heavily doped region 24 may be 6 mils to 12 mils. In another embodiment, the area of the active structure 10 of the first portion 20 may be smaller than the area of the first-type heavily doped region 24 of the second portion 22.

Referring to FIG. 2, in one embodiment, the semiconductor device further includes a substrate 4, and the first-type semiconductor structure 1, the active structure 10, and the second-type semiconductor structure 2 are sequentially formed on the substrate 4. The substrate 4 may be a growth substrate on which the semiconductor stack is grown, or the semiconductor stack may be epitaxially grown on another substrate (not shown) and then bonded to the substrate 4 through a transfer process. In this embodiment, the semiconductor device further includes a first conductive structure 30 and a second conductive structure 5. The first conductive structure 30 is disposed on the second-type semiconductor structure 2, and the second conductive structure 5 is disposed on the substrate 4 and distant from the second-type semiconductor structure 2 such that the first conductive structure 30 and the second conductive structure 5 are respectively located on opposite sides of the active structure 10 to form a vertical-type semiconductor device. In other embodiments, the semiconductor device is a horizontal-type structure, that is, the first conductive structure 30 and the second conductive structure 5 are disposed on the same side of the active structure 10. The first conductive structure 30 connects the second-type semiconductor structure 2 of the first portion 20 and the first-type heavily doped region 24 of the second portion 22 to achieve the electrostatic protection effect by the first-type heavily doped region 24.

In addition, the first conductive structure 30 has a light output aperture D1 disposed in the first portion 20 and substantially corresponding to the position of the current conduction region 202 so that light can be out of the semiconductor device from the light output aperture D1. The material of the first conductive structure 30 or the second conductive structure 5 includes a metal, such as gold, copper, nickel, titanium, platinum, aluminum, tin, or an alloy of the above metals. The semiconductor device of the present embodiment optionally includes a protective layer 26 interposed between the first conductive structure 30 and the second-type semiconductor structure 2 for preventing current from being directly injected into the second-type semiconductor structure 2 of the second portion 22 from the first conductive structure 30 so as to disperse the current injected into the second-type semiconductor structure 2 of the first portion 20 and therefore, to affect the luminous efficiency of the light-emitting region.

According to the above structure, in order to avoid the damage from external electrostatic voltage/current, an electrostatic protection region is formed to integrate the light-emitting region and the protection region into a single semiconductor device, e.g. a single semiconductor die. In addition, only one-time epitaxial growth is needed to produce the semiconductor device with both electrostatic protection and illumination so there is no need to additionally package any ESD protection components in the lighting module, which has the advantages and effects of savings package space, reducing production costs, and simplifying the process. The operation theory of the semiconductor device of some embodiments will be described below.

The terms "forward" and "reverse" described below are the directions of current flowing through the light-emitting region of the first portion 20. In detail, when the conductivity type of the second-type semiconductor structure 2 is p-type and the conductivity type of the first-type semiconductor structure 1 is n-type, the current flow direction of the light-emitting region of the first portion 20 is "forward" when the current flow direction is from the second-type semiconductor structure 2 to the first-type semiconductor structure 1. When the conductivity type of the second-type semiconductor structure 2 is p-type and the conductivity type of the first-type semiconductor structure 1 is n-type, the current flow direction of the light-emitting region of the first portion 20 is "reverse" when the current flow direction is from the first-type semiconductor structure 1 to the second-type semiconductor structure 2. Further, in the above embodiment, the conductivity type of the first-type heavily doped region 24 is n-type.

Under normal operation, the current supplied by the external power source flows from the first conductive structure 30 into the second-type semiconductor structure 2 of the first portion 20, and flows through the active structure 10, the first-type semiconductor structure 1, and the substrate 4 to the second conductive structure 5 so that the first portion 20 is driven to emit light. When an electrostatic discharge (ESD) occurs and generates a forward electrostatic current, the electrostatic protection region of the second portion 22 provides a current shunt path for enabling the forward electrostatic current to flow from the first-type heavily doped region 24 of the second portion 22 into the electrostatic protection zone to achieve a forward protection effect on the first portion 20. In detail, the forward electrostatic current is injected to the first conductive structure 30, and sequentially flows through the first-type heavily doped region 24, the first PN junction PN1, the second-type semiconductor structure 2 of the second portion 22, the active structure 10, the first-type semiconductor structure 1, to the second conductive structure 5. When an electrostatic discharge (ESD) occurs and generates a reverse electrostatic current, the current flows through the electrostatic protection region of the second portion 22 without passing through the first portion 20, thereby achieving a reverse protection effect on the first portion 20. In detail, the reverse electrostatic current flows from the second conductive structure 5 into the substrate 4, and sequentially flows through the first-type semiconductor structure 1, the active structure 10, the second-type semiconductor structure 2, and the first-type heavily doped region 24 of the second portion 22 to first conductive structure 30. When electrostatic discharge (ESD) produces a reverse or forward voltage and the reverse or forward voltage is greater than the threshold voltage of the semiconductor device, the second portion 22 may come into breakdown (e.g. tunneling breakdown) such that the forward electrostatic current or the reverse electrostatic current may flow through the second portion 22 to achieve the forward or reverse protection effect on the first portion 20. The threshold voltage described above may be the minimum voltage at which the second portion 22 comes into breakdown (e.g. tunneling breakdown).

The second thickness d2 of the first-type heavily doped region 24 can be designed to be smaller than the first thickness d1 of the second-type semiconductor structure 2. In other words, by controlling the doping depth, the thickness of the region of the second-type semiconductor layer 2 between the first-type heavily doped region 24 and the first-type semiconductor layer 2 can be adjusted, thereby controlling the threshold voltage of the second portion 22. In one embodiment, the second thickness d2 of the first-type heavily doped region 24 is greater than or equal to half the thickness of the first thickness d1 of the second-type semiconductor structure 2. For example, the first thickness d1 of the second-type semiconductor structure 2 is 6 μm and the second thickness d2 of the first-type heavily doped region 24 is 3 μm, but is not limited thereto. In addition, the doping concentrations of the first-type heavily doped region 24 and the second-type semiconductor structure 2 can be designed according to the desired threshold voltage. In one embodiment, the doping concentration of the first-type heavily doped region 24 is greater than or equal to 50 to 200 times the doping concentration of the second-type semiconductor structure 2. Further, if the difference between the doping concentration of the first-type heavily doped region 24 and the doping concentration of the second-type semiconductor structure 25 is not significant, the second portion 22 may lose the effect of protecting the first portion 20. In the present embodiment, the doping concentration of the first-type heavily doped region 24 is greater than or equal to one hundred times the doping concentration of the second-type semiconductor structure 2.

As can be seen from the above description, the semiconductor devices of some embodiments include the second portion 22 having the bidirectional electrostatic protection effect by forming the first-type heavily doped region 24 without additional electrostatic protection device or a semiconductor structure having a conductivity type different from the second-type semiconductor structure 2 so the device volume and the production cost can be reduced.

Figure 3:
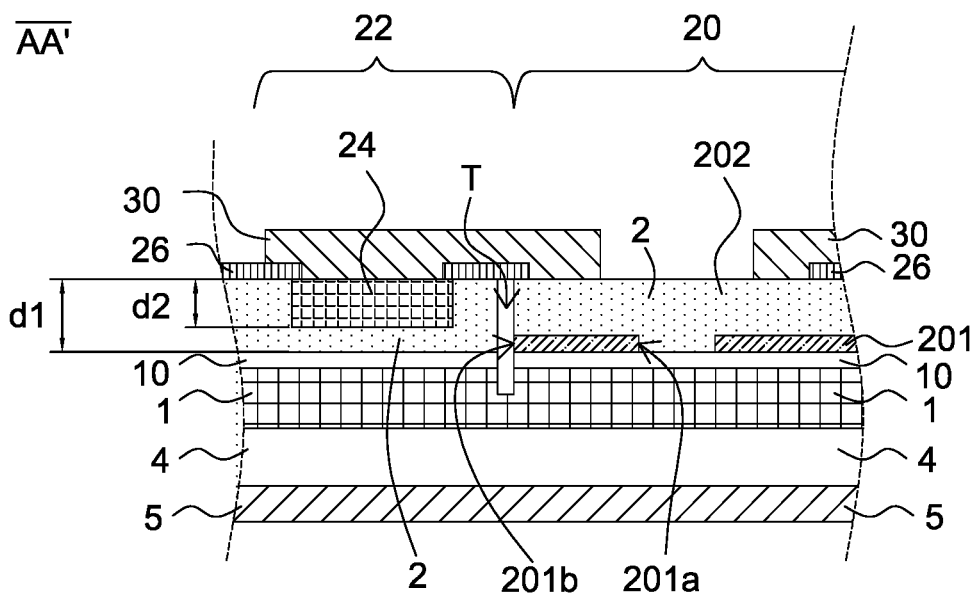
FIG. 3 shows a side view of a semiconductor device of another embodiment in accordance with the present disclosure.

FIG. 3 shows a side view of a semiconductor device in accordance with one embodiment of the present disclosure. The semiconductor device of FIG. 3 and the semiconductor device of FIG. 2 have the same top view and FIG. 3 is a side view along cross-section line AA' of FIG. 1. The semiconductor device of the present embodiment has a substantially similar structure to the semiconductor device shown in FIG. 2 and the difference is that the semiconductor device of the present embodiment further includes a trench T penetrating the second-type semiconductor structure 2 and the active structure 10 so that the first-type semiconductor structure 1 is exposed. The trench T is formed by dry etching or wet etching the second-type semiconductor structure 2 and then performing an oxidation process to oxidize the region where the current confinement region 201 of low conductivity is to be formed. In this embodiment, the trench T can also serve as a boundary dividing the first portion 20 and the second portion 22. The current confinement region 201 of the present embodiment contains aluminum oxide ($Al_2O_3$). In the present embodiment, the second-type semiconductor structure 2 and the active structure 10 of the first portion 20 is physically isolated from the second-type semiconductor structure 2 and the active structure 10 of the second portion 22 respectively by the trench T between the first portion 20 and the second portion 22.

Figure 4:
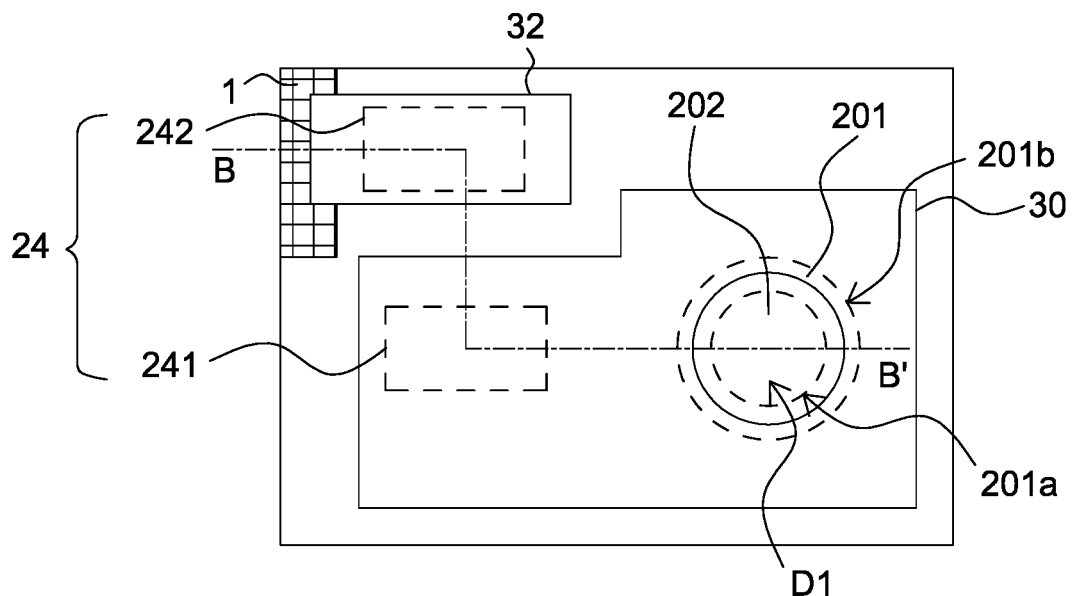
FIG. 4 shows a top view of a semiconductor device of one embodiment in accordance with the present disclosure.
Figure 5:
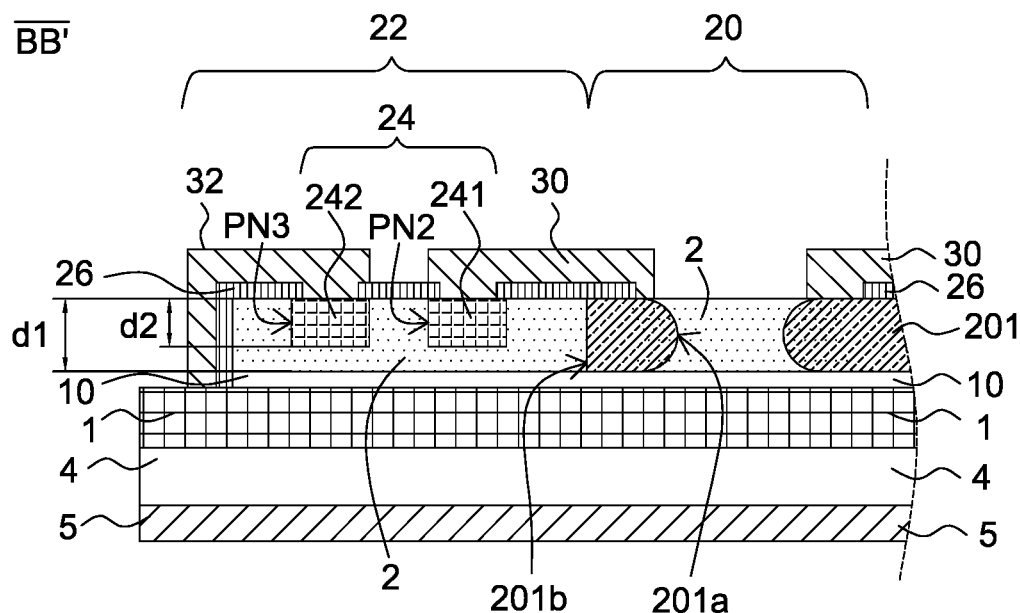
FIG. 5 shows a side view of a semiconductor device of one embodiment in accordance with the present disclosure taken along cross-section line BB' of FIG. 4.

FIG. 4 and FIG. 5 are respectively a top view of a semiconductor device in accordance with another embodiment of the present disclosure and a side view taken along cross-section line BB' of FIG. 4. The semiconductor device includes a first-type semiconductor structure, an active structure 10, and a second-type semiconductor structure 2 sequentially stacked on a substrate 4. The semiconductor device further includes a first conductive structure 30 disposed on the second-type semiconductor structure 2, and a second conductive structure 5 disposed on the substrate 4 and distant from the second-type semiconductor structure 2. The structural features, the connection relationships, and related embodiments of the various composed structures of the semiconductor device can be referred to the foregoing descriptions. Compared with FIG. 2, the structural difference of the semiconductor device of this embodiment is that the first-type heavily doped region 24 includes a first region 241 and a second region 242 separated from each other, and the first region 241 and the second region. 242 are located in the second-type semiconductor structure 2. In detail, the first region 241 and the second region 242 are surrounded by the second-type semiconductor structure 2, and the doping concentration of the first region 241 and the doping concentration of the second region 242 are higher than that of the second-type semiconductor structure 2. In the present embodiment, the doping concentration of the first region 241 is substantially the same as the doping concentration of the second region 242, and the first region 241 and the second region 242 are formed during the same process.

The first conductive structure 30 connects the second-type semiconductor structure 2 of the first portion 20 and the first region 241 of the first heavily doped region 24. Further, the semiconductor device further includes a connecting conductive structure 32 located on the second region 242 and the first-type semiconductor 1 of the second portion 22 and covering the side surface of the second-type semiconductor structure 2 and the side surface of the active structure 10 for connecting the second region 242 and the first-type semiconductor structure 1. The connecting conductive structure 32 is physically separated from the first conductive structure 30. The conductivity type of the first-type heavily doped region 24 is different from that of the second-type semiconductor structure 2. For example, in the first region 241, the second region 242 of the first-type heavily doped region 24 and the first-type semiconductor structure 1 are n-type semiconductors and the second-type semiconductor structure 2 is a p-type semiconductor. Or, the first region 241, the second region 242 of the first-type heavily doped region 24 and the first-type semiconductor structure 1 are p-type semiconductors, and the second-type semiconductor structure 2 is an n-type semiconductor. Therefore, a second PN junction PN2 exists between the first region 241 and the second semiconductor structure 2 and a third PN junction PN3 exists between the second semiconductor structure 2 and the second region 242. The semiconductor device of the present embodiment optionally includes a protective layer 26 between the first conductive structure 30 and the second-type semiconductor structure 2, between the connecting conductive structure 32 and the second-type semiconductor structure 2, and between the connecting conductive structure 32 and the active structure 10 to prevent the connecting conductive structure 32 from directly connecting the active structure 10, and prevent the connecting conductive structure 32 from directly connecting the second-type semiconductor structure 2.

Figure 6:
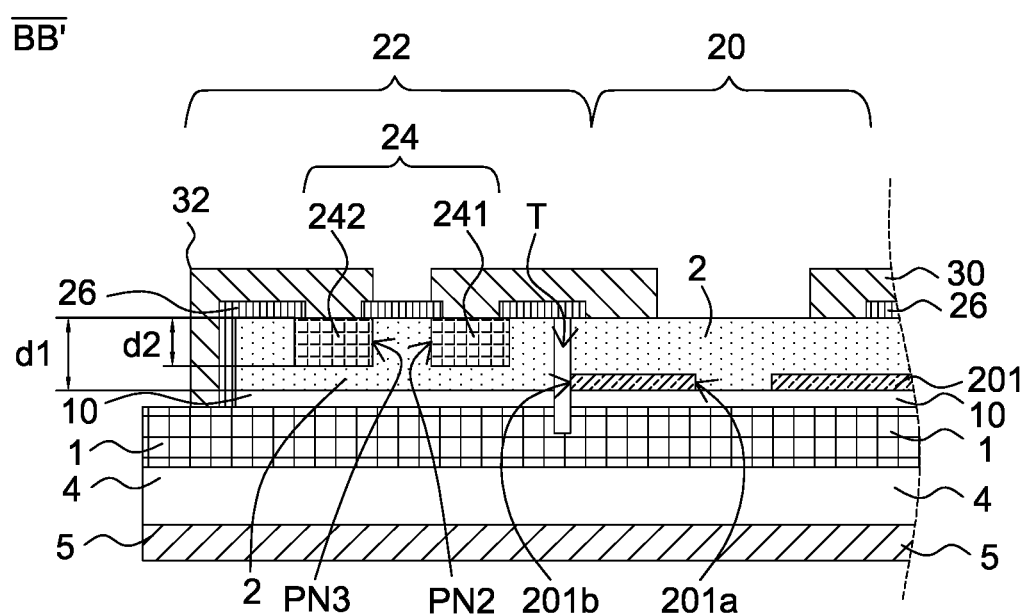
FIG. 6 shows a side view of a semiconductor device of another embodiment in accordance with the present disclosure.

FIG. 6 shows a side view of a semiconductor device of another embodiment in accordance with the present disclosure. The semiconductor device of FIG. 6 has the same top view as the semiconductor device of FIG. 5, and FIG. 6 is a side view taken along cross-section line BB' of FIG. 4. Compared with FIG. 5, the structural difference of the semiconductor device of the present embodiment lies in that a portion of the first-type semiconductor structure 1 is exposed by the trench T between the first portion 20 and the second portion 22 so that the second-type semiconductor structure 2 and the active structure 10 of the first portion 20 are physically isolated from the second-type semiconductor structure 2 and the active structure 10 of the second portion 22. The structural features, the connection relationships, and related embodiments of other composed structures can be referred to the foregoing descriptions.

Regarding how the second PN junction PN2 and the third PN junction PN3 are formed in the second-type semiconductor structure to integrally form the second portion 22 having the bidirectional electrostatic protection, the exemplary embodiments, structural features, and related embodiments have been described as the above. It should be noted that it is helpful to adjust the threshold voltage of the electrostatic protection portion when the current is in the forward direction and in the reverse direction by forming the first region 241 and the second region 242 separated from each other and in the second-type semiconductor structure 2. In this embodiment, since the doping concentration and the doping depth of the first region 241 are substantially the same as the doping concentration and the doping depth of the second region 242, the threshold voltage in the forward direction and the threshold voltage in the reverse direction have substantially the same absolute value. In detail, in the forward direction, the PN junction that the current first encounters in the second portion 22 is the second PN junction PN2 so the threshold voltage of the second portion 22 in the forward direction is determined by the doping concentration of the first region 241, the doping concentration of the second semiconductor structure 2, and/or the doping depth of the first region 241. In the reverse direction, the PN junction that the current first encounters in the second portion 22 is the third PN junction PN3 so the threshold voltage of the second portion 22 in the reverse direction is determined by the doping concentration of the second region 242, the doping concentration of the second semiconductor structure 2, and/or the doping depth of the second region 242. Moreover, the above-mentioned doping concentration and the doping depth of the first region 241 are substantially the same as those of the second region 242 respectively so the threshold voltages of the second portion 22 of the present embodiment in the forward direction and in the reverse direction have substantially the same absolute value.

Since the doping concentration of the first-type heavily doped region 24 is higher than the doping concentration of the second-type semiconductor structure 2 and the doping concentration of the first-type heavily doped region 24 is higher than that of the first-type semiconductor structure 1, the first-type heavily doped region 24 has a relatively lower resistance that facilitates the passage of electrostatic current. In this embodiment, when the semiconductor device is subjected to an electrostatic discharge (ESD) to generate a reverse electrostatic current, the reverse electrostatic current in the embodiments of FIG. 5 or FIG. 6 flows to the substrate 4 through the second conductive structure 5, and then flows through the first-type semiconductor structure 1, the connecting conductive structure 32, the second region 242, to the second semiconductor structure 2 and the first region 241, and finally reaches the first conductive structure 30, thereby effectively protecting the first portion 20 from the damage of the reverse electrostatic current. Conversely, when the semiconductor device receives an electrostatic discharge (ESD) to generate a forward electrostatic current, the forward electrostatic current can also flow reversely through the second portion 22 along the same conductive path to effectively protect the first portion 20. In one embodiment, the connecting conductive structure 32 may directly connect the substrate 4 by penetrating the first-type semiconductor structure 1 to further avoid the influence or damage of the electrostatic current on the first-type semiconductor structure 1.

Figure 7:
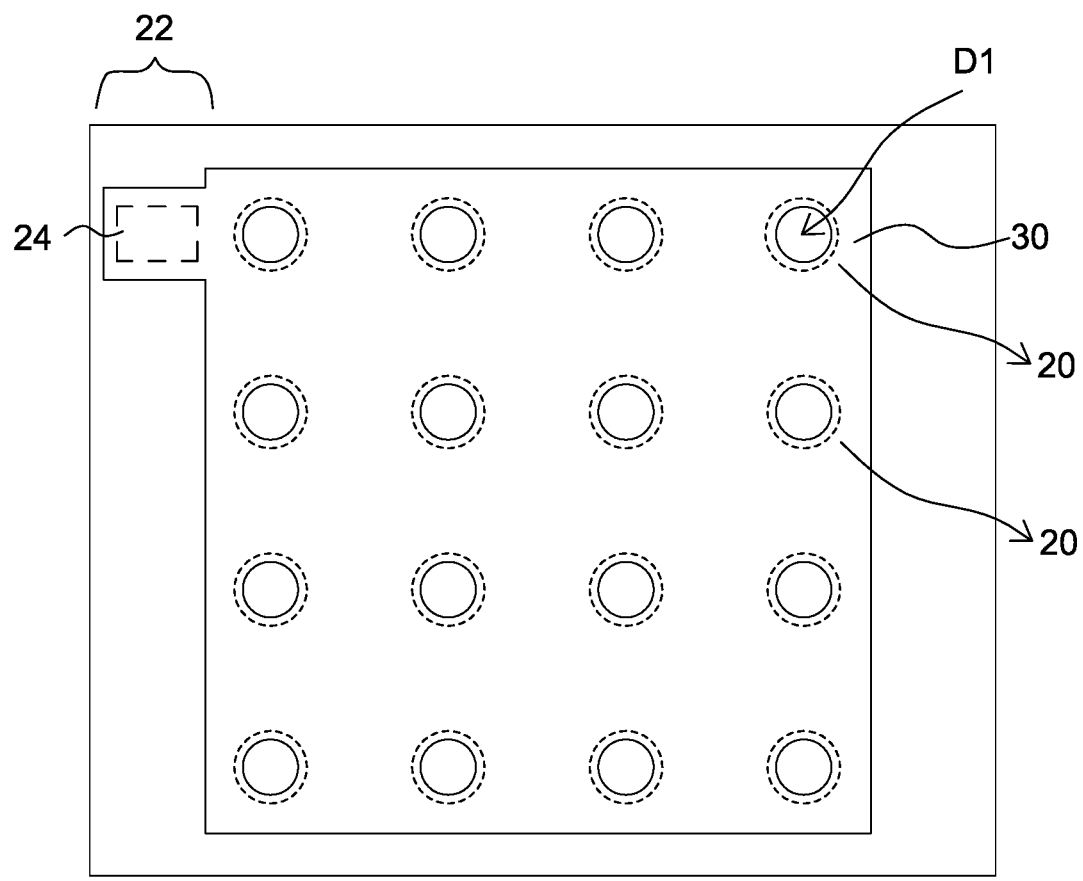
FIG. 7 shows a top view of a semiconductor device of one embodiment in accordance with the present disclosure.

Referring to FIG. 7, in one embodiment, the semiconductor device includes a plurality of adjacent first portions 20 and a plurality of light output apertures D1, and each of the light output apertures D1 corresponds to each of the first portions 20 to form a light-emitting array for emitting multiple light beams. It should be noted that even if the semiconductor device has a plurality of light output apertures D1, only a single second portion 22 is disposed to prevent the plurality of first portions 20 from being damaged by electrostatic discharge. Moreover, the area of the second portion 22 can be smaller than the overall area of the first portions 20 to achieve the advantage and effect of miniaturizing the semiconductor device.

In summary, some embodiments of the present disclosure provide a semiconductor device in the form of a single semiconductor die, in which the advantage and effect of electrostatic protection are achieved by introducing the first-type heavily doped region 24 in the semiconductor structure. At the same time, the doping concentration and the doping depth of the first-type heavily doped region 24 can be adjusted upon requirements, thereby effectively controlling the threshold voltage of the second portion 22. In addition, the first portion 20 and the second portion 22 are integrally formed by the semiconductor process, and the semiconductor device having the function of bidirectional electrostatic protection can be fabricated by just one-time growth process so that there is no need to additionally package any ESD protection components in the lighting module, which has the advantages and effects of savings package space, reducing production costs, and simplifying the process.

The above-mentioned semiconductor devices can be applied to sensing devices (such as face, iris, or fingerprint recognition), LiDAR (Light Detection and Ranging) devices, optical fiber communication devices, laser mice, lighting devices, medical devices, etc. Moreover, the semiconductor devices can also be integrated into mobile phones and/or other wearable devices, such as glasses or helmets for Augmented Reality (AR) or Virtual Reality (VR) in response to the demand from different applications.

The embodiments described above are merely illustrations of the technical spirit and features of the present invention for those skilled in the art to understand the present invention and practice the present disclosure and are not intended to limit the scope of the invention. The equivalent variations or modifications made under the spirit of the invention should also be covered by the scope of the invention.

What is claimed is:
1. A semiconductor device comprising:
 a semiconductor stack comprising a first-type semiconductor structure, an active structure on the first-type semiconductor structure, and a second-type semiconductor structure on the active structure, wherein the second-type semiconductor structure has a first doping concentration;

a first portion comprising a part of the first-type semiconductor structure, a part of the active structure, a part of the second-type semiconductor structure, and a current confinement region;

a second portion comprising a part of the first-type semiconductor structure, a part of the active structure, a part of the second-type semiconductor structure, and a first-type heavily doped region in the second-type semiconductor structure;

wherein the first-type heavily doped region has a second doping concentration higher than the first doping concentration of the second-type semiconductor structure and the first-type heavily doped region comprises a first region and a second region separated from each other.

2. The semiconductor device of claim 1, wherein the part of the second-type semiconductor structure in the second portion electrically connects to the part of the active structure in the second part.

3. The semiconductor device of claim 1, further comprising a first conductive structure electrically connecting the first portion and the second portion.

4. The semiconductor device of claim 3, wherein the first conductive structure fully covers the first-type heavily doped region.

5. The semiconductor device of claim 1, further comprising a trench between the first portion and the second portion.

6. The semiconductor device of claim 1, wherein the second doping concentration of the first-type heavily doped region is greater than or equal to one hundred times the first doping concentration of the second-type semiconductor structure.

7. The semiconductor device of claim 1, wherein the conductivity type of the first-type heavily doped region is different from that of the second-type semiconductor structure.

8. The semiconductor device of claim 7, wherein a first PN junction is between the first-type heavily doped region and the second-type semiconductor structure.

9. The semiconductor device of claim 1, wherein the second-type semiconductor structure has a first thickness, and the first-type heavily doped region has a second thickness smaller than the first thickness.

10. The semiconductor device of claim 1, wherein the semiconductor stack comprises a plurality of the first portions.

11. The semiconductor device of claim 1, wherein a second PN junction exists between the first region and the second-type semiconductor structure, and a third PN junction exists between the second-type semiconductor structure and the second region.

12. The semiconductor device of claim 1, wherein the first region of the first-type heavily doped region and the second region of the first-type heavily doped region have substantially the same doping concentration.

13. The semiconductor device of claim 1, further comprising a connecting conductive structure electrically connecting the second region of the first-type heavily doped region and the first-type semiconductor structure of the second portion.

14. The semiconductor device of claim 13, wherein the connecting conductive structure covers a side surface of the second-type semiconductor structure of the second portion.

15. The semiconductor device of claim 1, further comprising a second conductive structure and a substrate having two opposite sides, wherein the first conductive structure and the second conductive structure are respectively located on the two opposite sides of the substrate.

16. A semiconductor device comprising:

a semiconductor stack comprising a first-type semiconductor structure, an active structure on the first-type semiconductor structure, and a second-type semiconductor structure on the active structure, wherein the second-type semiconductor structure has a first doping concentration;

a first portion comprising a part of the first-type semiconductor structure, a part of the active structure, a part of the second-type semiconductor structure, and a current confinement region;

a second portion comprising a part of the first-type semiconductor structure, a part of the active structure, a part of the second-type semiconductor structure, and a first-type heavily doped region in the second-type semiconductor structure, wherein the first-type heavily doped region has a second doping concentration higher than the first doping concentration of the second-type semiconductor structure; and wherein the part of the second-type semiconductor structure in the second portion electrically connects to the part of the active structure in the second portion.

17. The semiconductor device of claim 16, wherein the part of the first-type semiconductor structure in the second portion electrically connects to the part of the second-type semiconductor structure in the second portion.

18. The semiconductor device of claim 16, further comprising a substrate and the semiconductor stack on the substrate, wherein the part of the second-type semiconductor structure in the second portion electrically connects to the substrate.

19. A semiconductor device comprising:

a semiconductor stack comprising a first-type semiconductor structure, an active structure on the first-type semiconductor structure, and a second-type semiconductor structure on the active structure, wherein the second-type semiconductor structure has a first doping concentration;

a first portion comprising a part of the first-type semiconductor structure, a part of the active structure, a part of the second-type semiconductor structure, and a current confinement region;

a second portion comprising a part of the first-type semiconductor structure, a part of the active structure, a part of the second-type semiconductor structure, and a first-type heavily doped region in the second-type semiconductor structure, wherein the first-type heavily doped region has a second doping concentration higher than the first doping concentration of the second-type semiconductor structure; and a first conductive structure on the semiconductor stack and fully covering the first-type heavily doped region.

20. The semiconductor device of claim 19, further comprising a connecting conductive structure on the second portion and physically separated from the first conductive structured; wherein the first-type heavily doped region comprises a first region and a second region separated from each other; wherein the first region is fully covered by the first conductive structure; and wherein the second region is fully covered by the connecting conductive structure.

* * * * *